(12) United States Patent
Quick

(10) Patent No.: US 7,618,880 B1
(45) Date of Patent: Nov. 17, 2009

(54) APPARATUS AND METHOD FOR TRANSFORMATION OF SUBSTRATE

(76) Inventor: Nathaniel R. Quick, 894 Silverado Ct., Lake Mary, FL (US) 32746

( * ) Notice: Subject to any disclaimer, the term of this patent is extended or adjusted under 35 U.S.C. 154(b) by 0 days.

(21) Appl. No.: 11/062,011

(22) Filed: Feb. 18, 2005

Related U.S. Application Data

(60) Provisional application No. 60/546,564, filed on Feb. 19, 2004.

(51) Int. Cl.
*H01L 20/00* (2006.01)
(52) U.S. Cl. .................. 438/478; 438/483; 438/798
(58) Field of Classification Search ......... 438/478–509, 438/795–799, 771, 779
See application file for complete search history.

(56) References Cited

U.S. PATENT DOCUMENTS

| | | | | |
|---|---|---|---|---|
| 4,446,169 A | * | 5/1984 | Castle et al. | 427/554 |
| 4,912,063 A | * | 3/1990 | Davis et al. | 117/97 |
| 4,912,064 A | * | 3/1990 | Kong et al. | 438/507 |
| 5,145,741 A | | 9/1992 | Quick | |
| 5,391,841 A | | 2/1995 | Quick | |
| 5,698,472 A | * | 12/1997 | Harris | 438/767 |
| 5,793,042 A | | 8/1998 | Quick | |
| 5,837,607 A | | 11/1998 | Quick | |
| 5,889,234 A | * | 3/1999 | Ghosh et al. | 174/250 |
| 6,025,609 A | | 2/2000 | Quick | |
| 6,054,375 A | | 4/2000 | Quick | |
| 6,242,784 B1 | * | 6/2001 | Zeng et al. | 257/409 |
| 6,271,576 B1 | | 8/2001 | Quick | |
| 6,391,748 B1 | * | 5/2002 | Temkin et al. | 438/478 |
| 6,670,693 B1 | | 12/2003 | Quick | |
| 6,703,294 B1 | * | 3/2004 | Schoner et al. | 438/519 |
| 6,838,395 B1 | * | 1/2005 | Kanzawa et al. | 438/781 |
| 2004/0053438 A1 | * | 3/2004 | Abe et al. | 438/93 |

FOREIGN PATENT DOCUMENTS

| | | | |
|---|---|---|---|
| JP | 358095830 | * | 6/1983 |
| JP | 405024975 | * | 2/1993 |
| JP | 2002128596 | * | 5/2002 |
| KR | 2004018009 | * | 8/2002 |

* cited by examiner

*Primary Examiner*—Savitri Mulpuri
(74) *Attorney, Agent, or Firm*—Frijouf, Rust & Pyle, P.A.

(57) ABSTRACT

A method is disclosed for forming a layer of a wide bandgap material in a non-wide bandgap material. The method comprises providing a substrate of a non-wide bandgap material and converting a layer of the non-wide bandgap material into a layer of a wide bandgap material. An improved component such as wide bandgap semiconductor device may be formed within the wide bandgap material through a further conversion process.

4 Claims, 4 Drawing Sheets

APPARATUS AND METHOD FOR TRANSFORMATION OF SUBSTRATE

CROSS-REFERENCE TO RELATED APPLICATIONS

This application claims benefit of United States Patent Provisional application Ser. No. 60/546,564 filed Feb. 19, 2004. All subject matter set forth in provisional application Ser. No. 60/546,564 is hereby incorporated by reference into the present application as if fully set forth herein.

BACKGROUND OF THE INVENTION

1. Field of the Invention

This invention relates to wide bandgap materials and more particularly to a method for forming a layer of a wide bandgap material in a non-wide bandgap material. The invention relates further to an improved component such as wide bandgap semiconductor device formed within the wide bandgap material.

2. Background of the Invention

Presently, silicon and gallium arsenide are the dominant conventional semiconductor materials used in the manufacture of semiconductor devices. Silicon and gallium arsenide are considered non-wide bandgap semiconductors. In contrast, wide bandgap semiconductors have superior properties including breakdown field, dielectric constant, thermal conductivity and saturated electron drift velocity. Unfortunately, wide bandgap semiconductors are expensive due to high processing costs and poor yields emanating from wafer growth through device packaging.

Ceramic substrates having wide bandgap semiconductor compositions, such as silicon carbide (SiC) and aluminum nitride (AlN), are known to exhibit electrical properties ranging from insulating electrical properties, semiconducting electrical properties and conducting electrical properties.

The wide-bandgap semiconductor phases of ceramics and other wide-bandgap semiconductors including diamond are used to create devices such as conductive tabs, interconnects, vias, wiring patterns, resistors, capacitors, semiconductor devices and the like electronic components by laser synthesis on the surfaces and within the body of such wide-bandgap semiconductors to thereby eliminate photolithography processes which require numerous steps and generate undesirable chemical pollutants when processing such traditional electronic devices, components and circuitry.

It is well known that alumina ($Al_2O_3$) dominates the dielectric market as an integrating substrate or device carrier in electronics packaging. Boron nitride (BN), aluminum nitride (AlN), silicon carbide (SiC) and diamond are also of interest due to the thermal coefficient of expansion (TCE) and for the dielectric constant and higher thermal conductivity than that of aluminum oxide ($Al_2O_3$). Silicon carbide (SiC), aluminum nitride (AlN), boron nitride (BN), gallium nitride (GaN) and diamond also exhibit a wide-band gap and chemical resistance as well as exhibiting properties from a semiconductor to an insulator. These properties are of substantial interest for high temperature applications approaching 1000° C. and for aggressive environment applications. In addition, these properties are desirable for high density integrated circuit packing.

In the prior art, metallization methods, including dry-film imaging and screen printing have been used for the production of conductive patterns on alumina. However, metal compatibility difficulties with high thermal conductivity ceramic materials such as aluminum nitride (AlN) and silicon carbide (SiC), have not been completely solved. Copper and silver paste exhibits a thermal coefficient of expansion (TCE) mismatch aggravated by high temperatures as well as being subject to oxidation that increases the resistivity. In particular, bonding of copper to aluminum nitride (AlN) has proved to be nontrivial. Alumina or stoichiometric aluminum oxynitride (AlON) coatings must be developed on the aluminum nitride (AlN) surface through passivation processes. These passivation processes have poor reproducibility. Thus, the direct laser synthesis of conductors in aluminum nitride (AlN), silicon carbide (SiC) and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

Discussion of wide bandgap materials and the processing thereof are discussed in my U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No. 6,271,576 and U.S. Pat. No. 6,670,693 are hereby incorporated by reference into the present application.

Therefore, it is an object of the present invention is to advance the art by providing a method for forming a layer of a wide bandgap material in a non-wide bandgap material.

Another object of this invention is to provide a method for forming a wide bandgap semiconductor device within the wide bandgap material.

Another object of this invention is to provide a wide bandgap semiconductor device within the wide bandgap material layer of the non-wide bandgap material.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a method of forming a wide bandgap layer in a non-wide bandgap material, comprising the steps of providing a substrate of a non-wide bandgap material and converting a layer of the non-wide bandgap material into a layer of a wide bandgap material.

It is understood that the conversion can be initiated at any point on the surface of the non-wide bandgap material surface and terminated at any point in the non-wide bandgap materials surface resulting in wide bandgap layers, layer portions, patterns and combinations thereof.

In a more specific example of the invention, the non-wide bandgap material has a bandgap equal to or less than two electron volts (2 eV) and the wide bandgap material has a bandgap greater than two electron volts (2 eV). The non-wide bandgap material is selected to be sensitive to the thermal conversion process of converting the layer into a wide bandgap material. In one specific example, the non-wide bandgap material is selected from the group consisting of a silicon material (Si), an alumina material ($Al_2O_3$) and a silica material ($SiO_2$). In another specific example, the layer is converted into a wide bandgap semiconductor material capable of being converted into an electrical component upon further irradiation by an energy beam.

In another embodiment of the invention, the step of converting a layer of the non-wide bandgap material into a wide bandgap material includes directing a thermal energy beam onto the surface to be converted. The thermal energy beam may be selected from the group consisting of a beam of charged particles, a beam of electrons, a beam of ions, a beam of electromagnetic radiation onto the surface for converting the surface into a wide bandgap layer. Preferably, a laser beam is directed onto the layer for converting the layer into a wide bandgap material by laser synthesis.

The invention is also incorporated into an improved component comprising a substrate of a non-wide bandgap material having a bandgap equal to or less than two electron volts (2 eV) and a layer of a wide bandgap material having a bandgap greater than two electron volts (2 eV) formed within the substrate. The component may comprise the layer of the wide bandgap material interconnecting a first and a second component.

In another example, the invention is incorporated into an improved semiconductor device comprising a substrate formed from a non-wide bandgap material and a wide bandgap semiconductor device formed in the layer of the wide bandgap semiconductor material. The wide bandgap semiconductor device may be an electrical device, a photonic device, an optical device and a spintronic device.

In a further example, the invention is incorporated into an improved semiconductor device comprising a substrate formed from a non-wide bandgap material and a layer of a wide bandgap semiconductor material formed in a portion of the substrate. A wide bandgap semiconductor device is formed in the layer of the wide bandgap semiconductor material. A non-wide bandgap device is formed in the non-wide bandgap material. An electrical connector interconnects the wide bandgap semiconductor device and the non-wide bandgap semiconductor devices.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
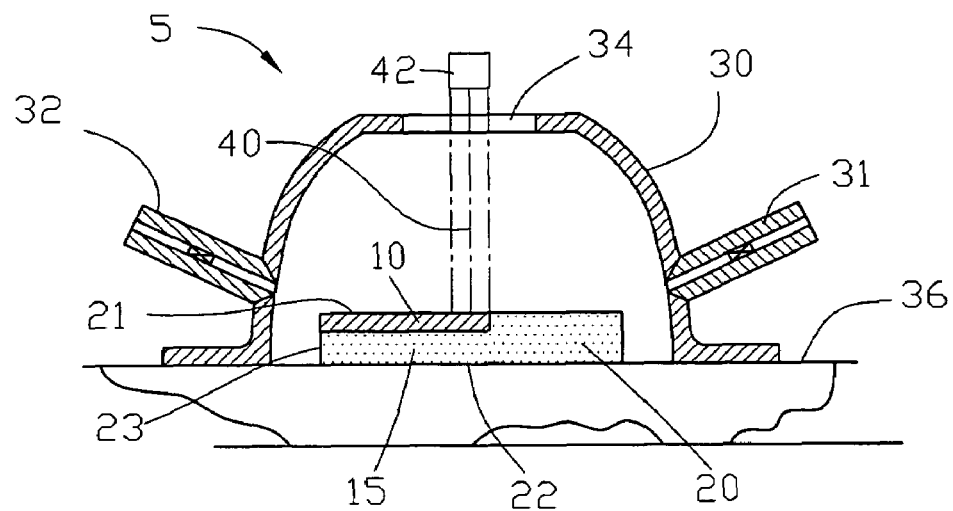
FIG. 1 is a side view of an air-tight chamber with a thermal energy beam impinging on a non-wide bandgap material for forming a layer of a wide bandgap material in the non-wide bandgap material.

FIG. 1 is a side view of an apparatus 5 for forming a layer of a wide bandgap material 10 in a non-wide bandgap material 15. The non-wide-bandgap material 15 is shown as a substrate 20 located in an air-tight chamber 30. The chamber 30 has an inlet and valve combination 31 and outlet and valve combination 32 connected to the side wall of the chamber 30 for injecting and removing gases into and therefrom, respectively. The chamber 30 includes an airtight transmission window 34. The chamber 30 is disposed on a support member 36 forming an airtight seal therewith.

Figure 2:
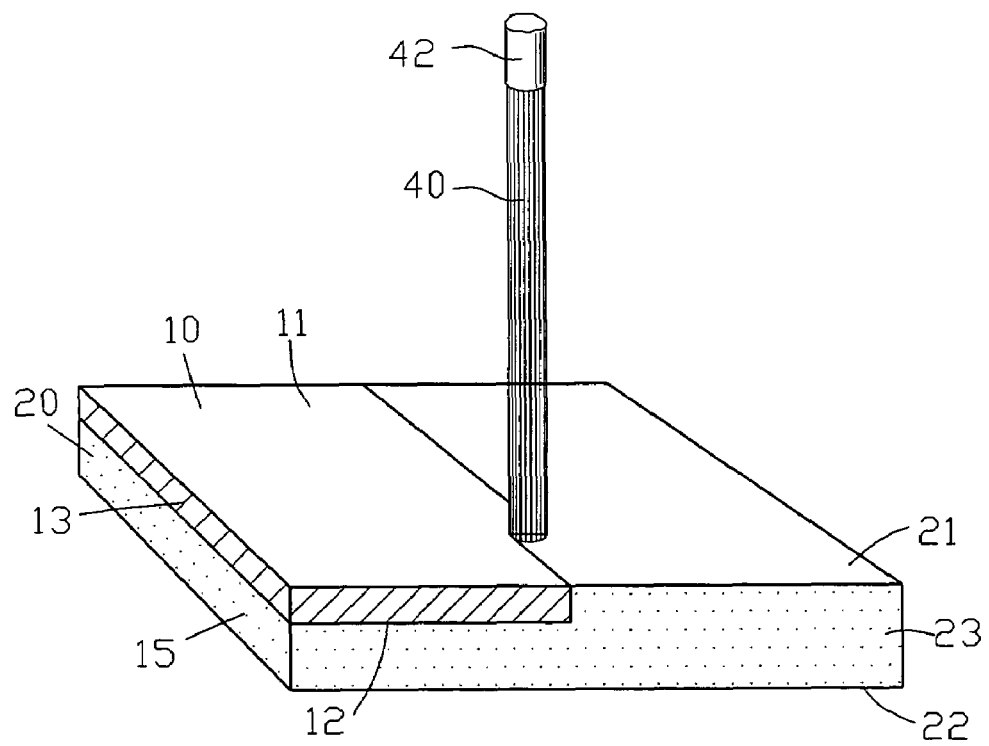
FIG. 2 is an enlarged isometric view of the layer of the wide bandgap material formed in the non-wide bandgap material.

FIG. 2 is an enlarged isometric view of the wide bandgap material 10 formed in the substrate 20 shown in FIG. 1. The wide bandgap material 10 defines a first and a second surface 11 and 12 and a peripheral edge 13. The substrate 20 defines a first and a second surface 21 and 22 and a peripheral edge 23. Although the substrate 20 is shown as a square, the present invention is not limited by the physical configuration of the substrate 20 as shown herein.

A thermal energy beam 40 is shown emanating from a source 42 and passing through the airtight transmission window 34 to impinge on the first surface 21 of the substrate 20. In one example, the thermal energy beam 40 is a beam of charged particles such as a beam of electrons or a beam of ions. In another example, the thermal energy beam 40 is a beam of electromagnetic radiation such as a laser beam. Examples of a suitable source of the laser beam include a Nd:YAG laser, a frequency double $2\bar{\omega}$ Nd:YAG laser or an Excimer laser.

The thermal energy beam 40 is scanned in two dimensions across the first surface 21 of the substrate 20 to form the wide bandgap material 10. In this example, the wide bandgap material 10 is shown partially formed within the first surface 21 of the substrate 20 after a partial scan of the thermal energy beam 40 across the first surface 21 of the substrate 20.

The first surface 11 of the wide bandgap material 10 is coincident with the first surface 21 of the wideband gap semiconductor substrate 20 with the remainder of the wide bandgap material 10 including the second surface 12 and the peripheral surface 13 being embedded between first and second surfaces 21 and 22 of the substrate 20.

The substrate 20 may be formed as a monolith or a thin film substrate having suitable properties for forming the wide bandgap material 10. The non-wide bandgap material 15 has a bandgap equal to or less than two electron volts (2 eV). The wide bandgap bandgap material 10 has a bandgap greater than two electron volts (2 eV).

Preferably, the non-wide bandgap material 15 is sensitive to a thermal conversion process for transforming a layer of the non-wide bandgap material 15 into the wide bandgap material 10. In one example, the non-wide bandgap material 15 is selected from the group consisting of a silicon material (Si), an alumina material ($Al_2O_3$), a silica material ($SiO_2$). Preferably, the non-wide bandgap material 15 is capable of being transformed from a non-wide bandgap material 15 into the wide bandgap material 10 and is capable of being subsequently transformed into an electrical component or device upon further irradiating by the thermal energy beam 40.

Table 1 contrasts various properties of two popular non-wide bandgap semiconductor materials namely silicon (Si) and gallium arsenide (GaAs) with a wide bandgap semiconductor namely silicon carbide (SiC) and diamond.

TABLE 1

Semiconductor Properties

| Property | Silicon | Gallium Arsenide | 6H Silicon Carbide | Diamond |
| --- | --- | --- | --- | --- |
| Band Gap | 1.12 eV | 1.424 eV | 3 eV | 5.45 eV |
| Breakdown field | 0.3 MV/cm | 0.4 MV/cm | 3 MV/cm | 10 MV/cm |
| Dielectric constant | 11.7 | 12.9 | 10 | 5.5 |
| Thermal Conductivity | 1.3 W/K-cm | 0.55 W/K-cm | 5 W/K-cm | 22 W/K-cm |
| Saturated electron drift velocity | $1 \times 10^7$ cm/sec | $1 \times 10^7$ cm/sec | $2 \times 10^7$ cm/sec | $2.7 \times 10^7$ cm/sec |

The advantages of the properties of the wide bandgap material 10 is evident from a review of Table 1. Unfortunately, wide bandgap materials 10 are currently expensive due to high processing costs and poor yields emanating from wafer growth through device packaging. The present invention transforms a layer of the non-wide bandgap material 15 into a wide bandgap material 10 to provide the advantages of the properties of the wide bandgap material 10 with the cost advantages of the non-wide bandgap material 15.

The present invention may utilize a conventional semiconductor material such as silicon (Si) as the non-wide bandgap material 15. In the alternative, the present invention may utilize a low cost ceramic material such as alumina ($Al_2O_3$) or a low cost glass material such as silica ($SiO_2$).

Figure 3:
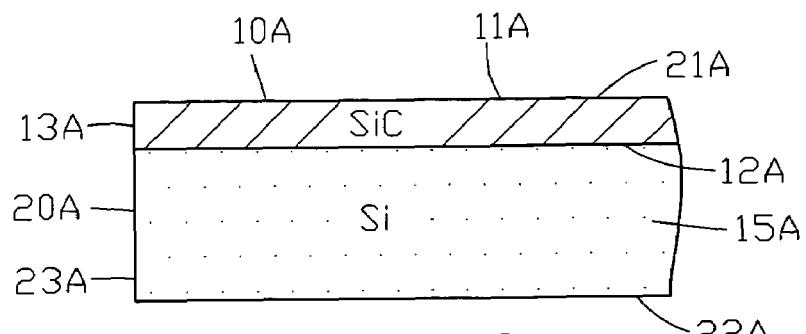
FIG. 3 is an enlarged partial sectional view of a first embodiment of silicon carbide (SiC) wide bandgap material formed in a silicon (Si) non-wide bandgap material.

FIG. 3 is an enlarged sectional view of a first embodiment of the invention illustrating a wide bandgap material 10A formed in the substrate 20A. In this example, the non-wide bandgap material 15A of the substrate 20A is a silicon (Si) material whereas the wide bandgap material 10A is silicon carbide (SiC).

The silicon (Si) non-wide bandgap material 15A is converted into the silicon carbide (SiC) wide bandgap material 10A as the thermal energy beam 40 scans across the first surface 21A of the substrate 20A. The thermal energy beam 40 scans across the first surface 21A of the substrate 20A in an atmosphere of methane gas or acetylene gas. The thermal energy beam 40 heats the silicon atoms of the non-wide bandgap material 15A. The heated silicon atoms of the non-wide bandgap material 15A react with the carbon atoms of the methane gas or acetylene gas atmosphere to create the silicon carbide (SiC) wide bandgap material 10A.

Figure 4:
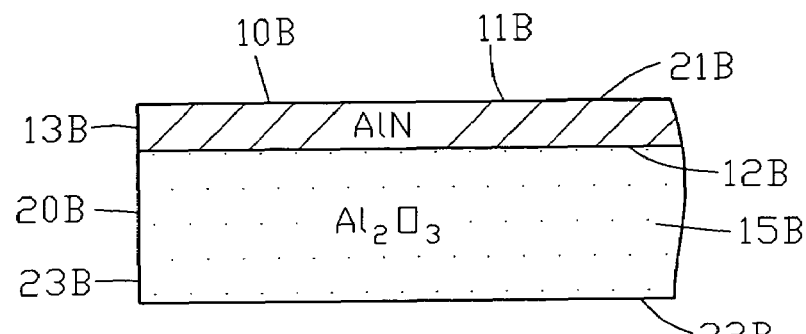
FIG. 4 is an enlarged partial sectional view of a second embodiment of an aluminum nitride (AlN) wide bandgap material formed in an alumina ($Al_2O_3$) non-wide bandgap material.

FIG. 4 is an enlarged sectional view of a second embodiment of the invention illustrating a wide bandgap material 10B formed in the substrate 20B. In this example, the non-wide bandgap material 15B of the substrate 20B is aluminum oxide ($Al_2O_3$) material whereas the wide bandgap material 10B is aluminum nitride (AlN).

The aluminum oxide ($Al_2O_3$) non-wide bandgap material 15B is converted into the aluminum nitride (AlN) wide bandgap material 10B as the thermal energy beam 40 scans across the first surface 21B of the substrate 20B. The thermal energy beam 40 scans across the first surface 21B of the substrate 20B in an atmosphere of nitrogen to create the aluminum nitride (AlN).

Typically, the formation of aluminum nitride (AlN) is not chemical and thermodynamically feasible because of the preferred affinity of aluminum for oxygen. A reacting getter such as source of heated carbon is used to remove the oxygen from reacting with the aluminum since oxygen has preferred reactions with carbon. The carbon can be a solid source or a gaseous source such as methane or acetylene. With the gaseous carbon sources the thermal energy beam 40 would be conducted under a mixed atmosphere of methane and nitrogen in simultaneous or subsequent steps.

The carbothermal process described above or a similar process is used only when the chemistry of the existing substrate is more stable than that of the desired or new substrate surface composition. Once the oxygen is removed, the surface 21B of the substrate 20B can be scanned with the thermal energy beam 40 in the presence of a doping nitrogen gas to create aluminum nitride (AlN). Subsequently, the aluminum nitride (AlN) wide bandgap material 10B may be converted to semiconductors and conductors, or other device in accordance with the teaching of my previously mentioned U.S. Patents.

Figure 5:
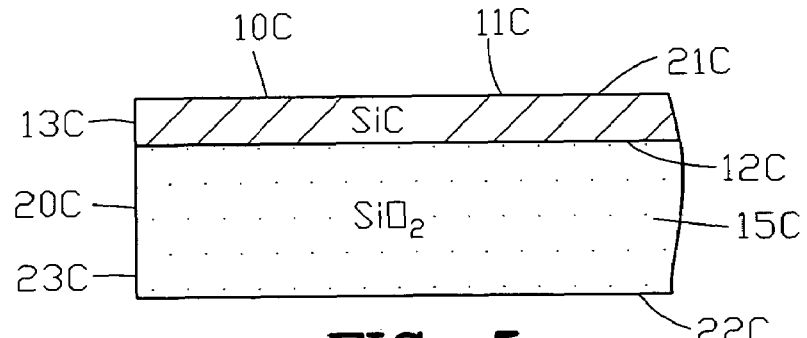
FIG. 5 is an enlarged partial sectional view of a third embodiment of a silicon carbide (SiC) wide bandgap material formed in a silica ($SiO_2$) non-wide bandgap material.

FIG. 5 is an enlarged sectional view of a third embodiment of the invention illustrating a wide bandgap material 10C formed in the substrate 20C. In this example, the non-wide bandgap material 15C of the substrate 20C is a silica ($SiO_2$) material whereas the wide bandgap material 10C is silicon carbide (SiC).

The silica ($SiO_2$) non-wide bandgap material 15C is converted into the silicon carbide (SiC) wide bandgap material 10C as the thermal energy beam 40 scans across the first surface 21C of the substrate 20C. The thermal energy beam 40 scans across the first surface 21C of the substrate 20C in an atmosphere of methane gas or acetylene gas. The thermal energy beam 40 heats the silicon atoms of the non-wide bandgap material 15C. The heated silicon atoms of the non-wide bandgap material 15C react with the carbon atoms of the methane gas or acetylene gas atmosphere to create the silicon carbide (SiC) wide bandgap material 10C.

Figure 6:
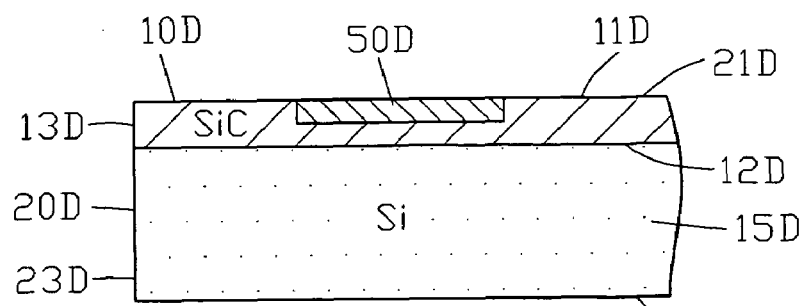
FIG. 6 is an enlarged partial sectional view of a fourth embodiment of a diamond like carbon material formed in the silicon carbide (SiC) wide bandgap material defined in a silicon (Si) non-wide bandgap material.

FIG. 6 is an enlarged sectional view of a fourth embodiment of the invention illustrating a component 50D defined in a wide bandgap material 10D formed in the substrate 20D. In this example, the component 50D is a diamond like carbon material (DLC) formed in the silicon carbide (SiC) wide bandgap material 10D defined in a silicon (Si) non-wide bandgap material 15D. The silicon (Si) non-wide bandgap material 15D is converted into the silicon carbide (SiC) wide bandgap material 10D as the thermal energy beam 40 scans across the first surface 21D of the substrate 20D as set forth with reference to FIG. 3.

After the silicon (Si) non-wide bandgap material 15D is converted into the silicon carbide (SiC) wide bandgap material 10D, the silicon carbide (SiC) is converted into the diamond like carbon material (DLC) by selectively removing silicon atoms to create vacancies. The vacancies are then filled with carbon creating the diamond like carbon material (DLC). The thermal energy beam 40 irradiation of the SiC region in a CO/CO2 containing atmosphere diffuses silicon to the surface where the silicon reacts with $CO_2$ to form SiO gas. An increased number of vacancies are left behind in the lattice.

An excimer laser (50 mJ/pulse, 10 Hz pulse repetition rate, 60 pulses, 193 nm wavelength, 20 ns pulse time, CO(partial pressure)/$CO_2$ (partial pressure)=$5 \times 10^4$) creates the temperature range 2000-2300° C. necessary to energize silicon (Si) self diffusion in silicon carbide (SiC). Carbon is then diffused into the substrate to fill the vacancies by laser irradiation, for example by (Nd:YAG, excimer etc.) in a methane or acetylene atmosphere to dissociate the hydrocarbon and drive (diffuse) atomic carbon into the silicon carbide (SiC) and if necessary orient or recrystallize the crystal structure.

Figure 7:
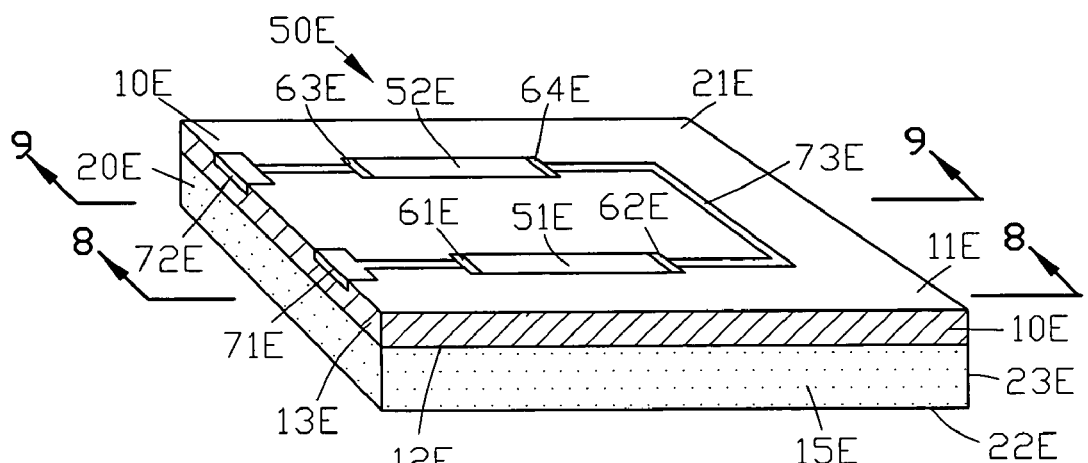
FIG. 7 is an enlarged isometric view of a fifth embodiment of an improved component formed in the wide bandgap material.

FIG. 7 is an enlarged isometric view of a fifth embodiment of the invention illustrating a semiconductor device 50E defined in the wide bandgap material 10E formed in the substrate 20E. The semiconductor device 50E may be one or more of a variety of devices such as an active or passive electrical device, a photonic device, an optical device, a sensor device, a spintronic device o or any other suitable semiconductor device. In this example, the semiconductor device 50E is shown as a first semiconductor device 51E and a second semiconductor device 52E.

Figure 8:
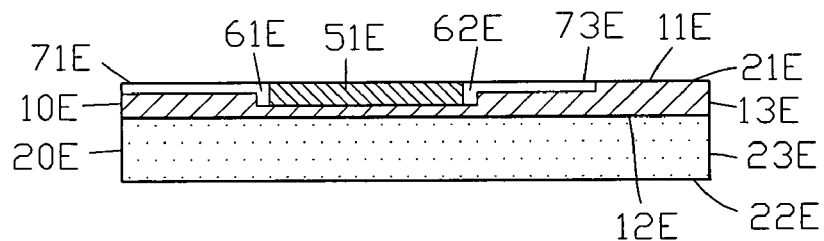
FIG. 8 is a sectional view along line 8-8 in FIG. 7.

FIG. 8 is a sectional view along line 8-8 in FIG. 7 illustrating the first semiconductor device 51E of FIG. 7. The first semiconductor device 51E is defined in the wide bandgap material 10E. The first semiconductor device 51E is connected by an electrode 61E to a first conductor 71E. An electrode 62E connects the first semiconductor device 51E to a connector 73E.

Figure 9:
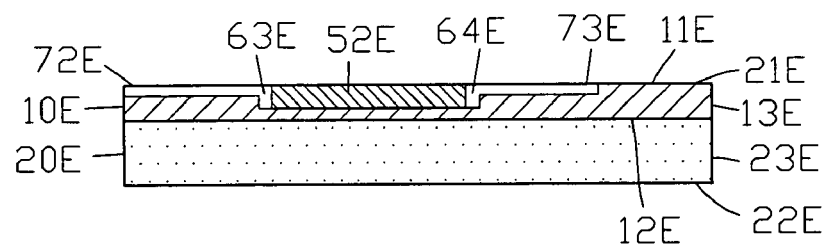
FIG. 9 is a sectional view along line 9-9 in FIG. 7.

FIG. 9 is a sectional view along line 9-9 in FIG. 7 illustrating the second semiconductor device 52E of FIG. 7. The second semiconductor device 52E is defined in the wide bandgap material 10E. The second semiconductor device 52E is connected by an electrode 63E to a second conductor 72E. An electrode 64E connects the second semiconductor device 52E to the connector 73E.

Preferably, the first and/or second semiconductor device 51E and 52E are formed in the wide bandgap material 10E by scanning the thermal energy beam 40 across selected portions of the wide bandgap material 10E in the presence of a doping atmosphere to form the first and/or second semiconductor device 51E and 52E. In the alternative, the first and/or second semiconductor device 51E and 52E may be formed in a conventional manner as should be well known in the art.

Figure 10:
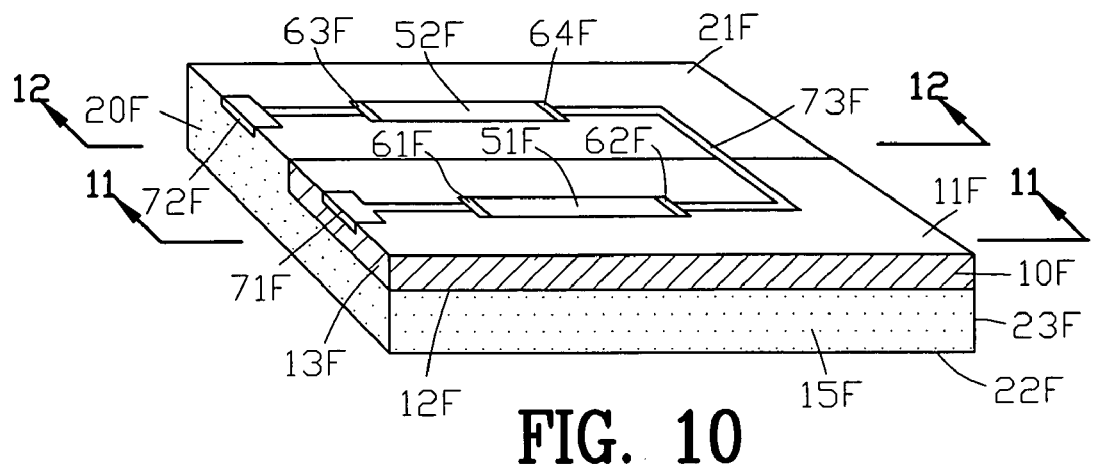
FIG. 10 is an enlarged isometric view of a sixth embodiment of an improved semiconductor device formed in the wide bandgap material.

FIG. 10 is an enlarged isometric view of a sixth embodiment of the invention illustrating a first semiconductor device 51F defined in the wide bandgap material 10F and a second semiconductor device 52F defined in the non-wide bandgap material 15F.

Figure 11:
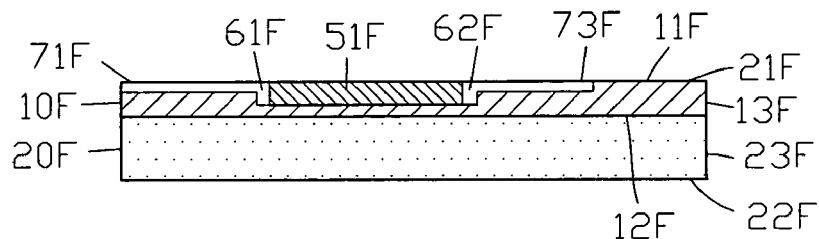
FIG. 11 is a sectional view along line 11-11 in FIG. 10.

FIG. 11 is a sectional view along line 11-11 in FIG. 10 illustrating the first semiconductor device 51F of FIG. 10. The first semiconductor device 51F is defined in the wide bandgap material 10F. The first semiconductor device 51F is connected by an electrode 61F to a first conductor 71F. An electrode 62F connects the first semiconductor device 51F to a connector 73F. The first semiconductor device 51F may be one or more of a variety of devices such as an active or passive electrical device, a photonic device, an optical device, a sensor device, a spintronic device or any other suitable semiconductor device.

Preferably, the first semiconductor device 51F is formed in the wide bandgap material 10F by scanning the thermal energy beam 40 across selected portions of the wide bandgap material 10F in the presence of a doping atmosphere to form the first semiconductor device 51F. In the alternative, the first semiconductor device 51F may be formed in a conventional manner as should be well known in the art.

Figure 12:
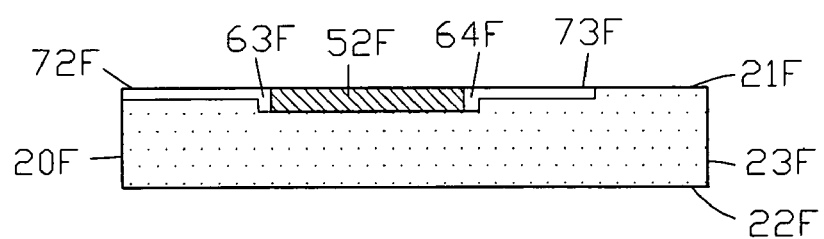
FIG. 12 is a sectional view along line 12-12 in FIG. 10.

FIG. 12 is a sectional view along line 12-12 in FIG. 10 illustrating the second semiconductor device 52F of FIG. 10. The second semiconductor device 52F is defined in the non-wide bandgap material 15F. The second semiconductor device 52F is connected by an electrode 63F to a second conductor 72F. An electrode 64F connects the second semiconductor device 52F to the connector 73F.

Preferably, the second semiconductor device 52F is formed in the non-wide bandgap material 15F in a conventional manner as should be well known in the art. In the alternative, the second semiconductor device 52E may be formed by scanning the thermal energy beam 40 across selected portions of the non-wide bandgap material 15F in the presence of a doping atmosphere to form the second semiconductor device 52F.

The thermal energy beam 40 conversion and doping technology can be applied to the fabrication of conductors, different semiconductor and insulator phases in silicon carbide (SiC). Conductors can be fabricated by doping titanium into silicon carbide (SiC) by laser scanning in a titanium tetra chloride, or other titanium metallo-organic gas atmosphere. Different semiconductor phases can be created by scanning a material with the thermal energy beam 40 in an atmosphere of nitrogen (n-type), phosphine (n-type) or di-borane (p-type), trimethylaluminum (p-type) etc. Insulators can be created by scanning a material with the thermal energy beam 40 in an atmosphere of oxygen.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method of forming a second wide bandgap layer in a first wide bandgap oxide material, comprising the steps of:
    providing the first wide bandgap oxide material;
    directing a first thermal energy beam onto the first wide bandgap oxide material in the presence of a carbon source to react the oxide within the first wide bandgap oxide material with the carbon source to form a carbon oxide for removing oxygen from the first wide bandgap oxide material;
    providing a doping gas having at least one element common to the second wide bandgap material;
    applying the doping gas to the first wide bandgap material; and
    directing a second thermal energy beam onto the first wide bandgap material in the presence of the doping gas for enabling the element of the doping gas to enter into the first wide bandgap material for converting a layer of the first wide bandgap oxide material into a layer of the second wide bandgap material.

2. A method of forming a second wide bandgap layer in a first wide bandgap oxide material, comprising the steps of:
    providing the first wide bandgap oxide material;

providing a mixture of a carbon source to react the oxide with carbon to form a carbon oxide thus removing the oxygen and providing a doping gas having at least one element common to the second wide bandgap material;

applying the gases to the first wide bandgap oxide material; and directing a thermal energy beam onto the first wide bandgap oxide material in the presence of the carbon source and doping gas mixture for enabling the element of the doping gas to enter into the first wide bandgap material for converting a layer of the first wide bandgap oxide material into a layer of the second wide bandgap material.

3. A method of forming aluminum nitride material (AlN) in an alumina material ($Al_2O_3$), comprising the steps of:

providing the alumina material ($Al_2O_3$);

providing a nitrogen doping gas;

applying the doping gas to the alumina ($Al_2O_3$) material; and directing the thermal energy beam onto the alumina material ($Al_2O_3$) in the presence of the doping gas for enabling an element of the doping gas to enter into the alumina material ($Al_2O_3$) for converting a layer of the alumina material ($Al_2O_3$) into a layer of the aluminum nitride material (AlN).

4. A method of forming a silicon carbide material (SiC) in a silica material ($SiO_2$), comprising the steps of:

providing the silica material ($SiO_2$);

providing a doping gas selected from the group consisting of methane and acetylene;

applying the doping gas to the silica material ($SiO_2$); and directing the thermal energy beam onto the silica material ($SiO_2$) in the presence of the doping gas for enabling an element of the doping gas to enter into the silica material ($SiO_2$) for converting a layer of the silica material ($SiO_2$) into a layer of the silicon carbide material (SiC).

* * * * *